US008108082B2

(12) United States Patent
Yeh et al.

(10) Patent No.: US 8,108,082 B2
(45) Date of Patent: Jan. 31, 2012

(54) OUTDOOR ENCLOSURE COOLING SYSTEM OPERATING AT OFF-PEAK HOURS

(75) Inventors: Joseph Yeh, Plano, TX (US); Walter Hendrix, Richardson, TX (US)

(73) Assignee: CommScope, Inc. of North Carolina, Hickory, NC (US)

( * ) Notice: Subject to any disclaimer, the term of this patent is extended or adjusted under 35 U.S.C. 154(b) by 351 days.

(21) Appl. No.: 12/427,039

(22) Filed: Apr. 21, 2009

(65) Prior Publication Data

US 2010/0063647 A1 Mar. 11, 2010

Related U.S. Application Data

(60) Provisional application No. 61/096,239, filed on Sep. 11, 2008.

(51) Int. Cl.
| | |
|---|---|
| *H01H 43/00* | (2006.01) |
| *G05B 21/00* | (2006.01) |
| *G05B 13/00* | (2006.01) |
| *G05B 15/00* | (2006.01) |
| *G01M 1/38* | (2006.01) |
| *G05D 23/00* | (2006.01) |
| *G05D 23/32* | (2006.01) |
| *G01K 17/00* | (2006.01) |
| *H05K 7/20* | (2006.01) |
| *F28D 15/00* | (2006.01) |
| *F25B 29/00* | (2006.01) |
| *F25B 21/02* | (2006.01) |
| *F25D 11/00* | (2006.01) |

(52) U.S. Cl. ........ 700/306; 700/278; 700/300; 702/136; 361/704; 165/104.333; 165/254; 165/287; 62/3.6; 62/157; 62/440

(58) Field of Classification Search .................. 700/276, 700/278, 299, 300, 306; 702/130, 132, 136; 165/104.33, 200, 201, 287, 288, 291, 253, 165/254; 62/157, 440, 3.1, 3.2, 3.6, 132; 361/600, 679.01, 688, 699, 700, 704
See application file for complete search history.

(56) References Cited

U.S. PATENT DOCUMENTS

| | | | |
|---|---|---|---|
| 4,129,014 A | | 12/1978 | Chubb |
| 4,827,735 A | | 5/1989 | Foley |
| 5,036,904 A | | 8/1991 | Kanda |
| 5,255,526 A | | 10/1993 | Fischer |
| 5,934,079 A | | 8/1999 | Han |
| 6,041,851 A | * | 3/2000 | Diebel et al. ............. 165/104.33 |
| 6,079,481 A | | 6/2000 | Lowenstein |
| 6,104,611 A | * | 8/2000 | Glover et al. ................. 361/700 |

(Continued)

FOREIGN PATENT DOCUMENTS

JP 05-145259 A 6/1993

(Continued)

*Primary Examiner* — Crystal J Barnes-Bullock

(74) *Attorney, Agent, or Firm* — Muncy, Geissler, Olds & Lowe, PLLC

(57) ABSTRACT

A cooling system and method for an outdoor electronics enclosure includes an air conditioner controlled to operate during off-peak hours, so as to pre-cool batteries. The cooled batteries keep the enclosure cool during peak hours so that it is not necessary to run the air conditioner when electricity prices are at their peak. A clock or light sensor determines the time of day. A controller has stored data indicating the peak hours when electricity costs more.

18 Claims, 2 Drawing Sheets

U.S. PATENT DOCUMENTS

| | | | |
|---|---|---|---|
| 6,123,266 A | 9/2000 | Bainbridge | |
| 6,834,715 B2 | 12/2004 | Garcia | |
| 6,994,156 B2 * | 2/2006 | Kopko | 165/201 |
| 7,227,749 B2 * | 6/2007 | Rockenfeller | 361/688 |
| 7,270,910 B2 * | 9/2007 | Yahnker et al. | 429/62 |
| 7,299,148 B2 * | 11/2007 | Hunt et al. | 702/130 |
| 7,574,283 B2 * | 8/2009 | Wang et al. | 700/276 |
| 7,848,900 B2 * | 12/2010 | Steinberg et al. | 702/130 |
| 7,890,218 B2 * | 2/2011 | Adams et al. | 700/300 |
| 2003/0094263 A1 | 5/2003 | Garcia | |
| 2003/0231467 A1 | 12/2003 | Replogle | |
| 2006/0288729 A1 * | 12/2006 | Arjomand | 62/441 |
| 2007/0227721 A1 * | 10/2007 | Springer et al. | 165/291 |
| 2008/0104965 A1 | 5/2008 | Petratos | |
| 2009/0012651 A1 * | 1/2009 | Lifson et al. | 700/276 |
| 2009/0195349 A1 * | 8/2009 | Frader-Thompson et al. | 340/3.1 |
| 2009/0277187 A1 * | 11/2009 | McGann | 62/3.6 |
| 2010/0207598 A1 * | 8/2010 | Hamatani | 323/351 |

FOREIGN PATENT DOCUMENTS

KR   10-2006-0062081 A   6/2006

* cited by examiner

OUTDOOR ENCLOSURE COOLING SYSTEM OPERATING AT OFF-PEAK HOURS

CROSS REFERENCE TO RELATED APPLICATION

The present invention claims the benefit of U.S. Provisional Patent application No. 61/096,239, filed Sep. 11, 2008, the entire contents of which is hereby incorporated by reference.

FIELD OF THE INVENTION

The present invention is directed toward a cooling system for an outdoor electronics enclosure and more specifically, toward a cooling system for an outdoor electronics enclosure being controlled to cool when power is less expensive.

BACKGROUND OF THE INVENTION

Outdoor enclosures for electronic systems and telecommunications systems are known. Some enclosures also include batteries, such as valve-regulated lead acid (VRLA) batteries as a backup power supply for the electronics. It is important to regulate the temperature of the inside of the enclosure to specified levels. This is necessary in order to ensure the proper operation of the electronics and also the batteries.

If the equipment within the enclosure produces a large amount of heat, the only method of cooling that is adequate for the task is direct air cooling. For other equipment which is less demanding, an air conditioner may be sufficient. Active electronic or telecommunications equipment will operate properly at temperatures up to 50, 55 or even 65° C. However, if batteries are present within the same enclosure, the batteries rapidly lose the ability to retain a charge if the temperatures exceed 30° C. for an extended period of time. Thus, some form of air-conditioning is necessary to maintain the temperatures of the batteries near 25° C.

While the use of air conditioning to keep the batteries at a proper temperature is often necessary, there is an expense associated with running such an air conditioner. Reducing the cost of cooling the enclosure is a desirable feature in order to reduce the overall costs of running the equipment.

SUMMARY OF THE INVENTION

These problems are addressed by the present invention where a cooling system is controlled to be operated when the price of electricity is reduced. In addition, the thermal capacitance of the batteries is used to store the cooling for use later.

A sensor arrangement is provided to determine the time of day and the cost of electricity at that time. The air conditioner operates to cool the batteries below their usual operating temperature while the cost of electricity is lower. The batteries stay cold due to their thermal capacitance even after the outside temperature starts to rise.

By running the air conditioner at a time when electricity is less expensive and storing it using the thermal capacitance of the batteries, it is possible to avoid some of the cost of running the air conditioner at the time of the day when power is more expensive.

BRIEF DESCRIPTION OF THE DRAWINGS

These and other aspects and features of embodiments of the present invention will be better understood after reading of the following detailed description, together with the attached drawings, wherein.

DETAILED DESCRIPTION

Figure 1:
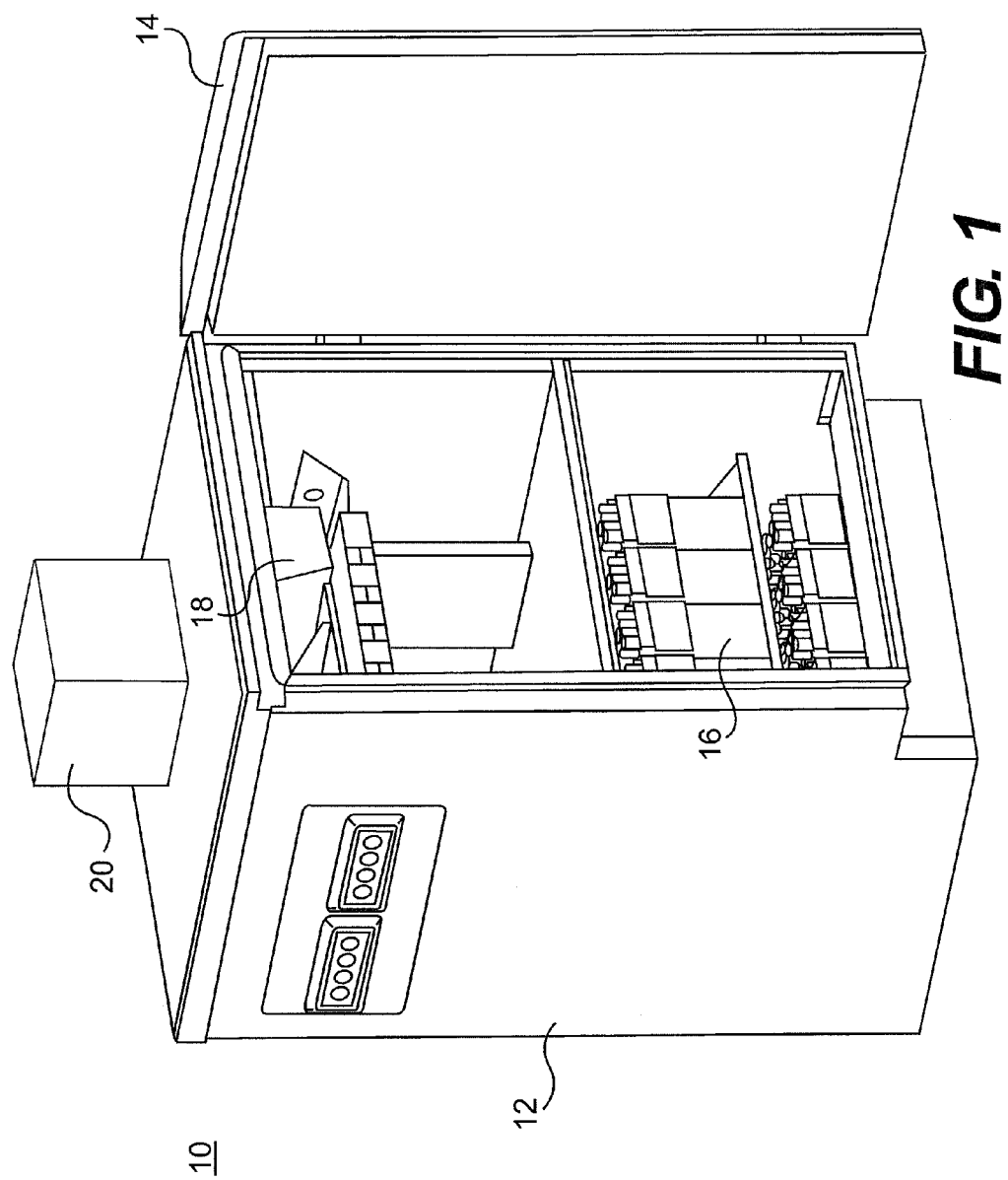
FIG. 1 is a perspective view of the cooling system of the present invention.

The present invention now is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity.

The terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "lateral", "left", "right" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features.

The device may be otherwise oriented (rotated 90 degrees or at other orientations) and the descriptors of relative spatial relationships used herein interpreted accordingly.

Turning now to FIG. 1, the system 10 of the present invention can be seen as including an enclosure 12. This enclosure is designed to be installed in the outdoors to house electronics connected to a telecommunication or other similar electronics system. The enclosure may also have a door 14 for accessing the inside of the enclosure for servicing the electronics and batteries.

The enclosure contains at least electronics 18 which are necessary for the telecommunication system and batteries 16 which act as backup power for the electronics in case the local power system is inoperative. This backup power can also be used to power the air conditioning unit 20 if the AC power is not operational.

The air conditioning unit 20 may be mounted on top of the enclosure as shown, or may be mounted beside or behind it, as space permits. It may also be mounted in the door 14 of the enclosure. The purpose of the air conditioner is to cool the inside of the enclosure so that the electronics and batteries are kept at a temperature which enable them to perform effectively and efficiently. Some enclosures have separate compartments for the electronics and batteries. Separate air conditioners may be used for the compartments so that the compartments may be cooled to different temperatures, since the operational temperature of the batteries is lower than that of the electronics.

There is a certain cost associated with powering the air conditioner to keep the enclosure cool. Not only do the electronics generate heat, but heat is also received from the ambient outside air and incident sunlight. Naturally, the amount of ambient heat and incident sunlight varies over the course of the day, with less heat being received during the night and more heat being received in the middle of the day. Unfortunately, this is the same pattern of usage that homes and other buildings follow, so that power companies experience their greatest power demand during the afternoon hours, which is usually referred to as the peak demand period.

In order to encourage users to shift some power demand away from peak hours, some power companies charge less for electricity during off-peak hours. It is thus advantageous for consumers to defer the use of electrical appliances in order to save money on their utility bill. Likewise, it would be possible for telecommunications companies which operate outdoor enclosures to save money if the air conditioner could be run at off-peak hours.

Figure 2:
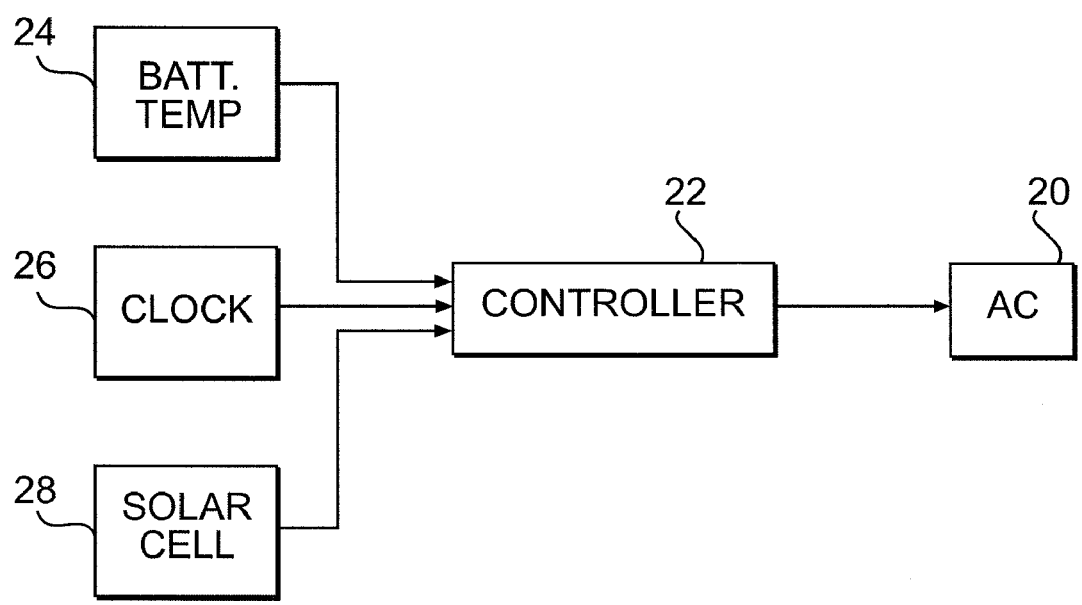
FIG. 2 is a schematic diagram of the control system of the present invention.

FIG. 2 is an electrical schematic which shows a controller 22 connected to the air conditioner 20 of the enclosure. The controller determines when the air conditioner should be turned on, based on input from various sensors. Battery temperature sensor 24 determines the temperature of the batteries. This sensor is in contact with the metal terminal post of one or more of the batteries.

In a simple system, the controller could rely on the battery sensor alone and merely turn on the air conditioner when the battery temperature exceeds a desired temperature. However, there would be no cost savings based on the off-peak electricity prices. By supplying the controller with other information, it may be possible to operate the air conditioner during off-peak hours to reduce the cost of operation.

One possible source of information could be a simple clock or timer 26 which indicates to the controller whether it is day or night, and even the exact hour of the day. If the controller has a memory which indicates the relative costs of power at different times, it would be possible to control the air conditioner to operate at the least expensive times. It would also be possible to instead use a solar cell 28 or similar light sensitive electronic device, such as a photodiode, phototransistor, cadmium sulphide (CdS) cell, etc. to indicate night and day to the controller so that the air conditioner operates at night.

If the air conditioner is controlled to come on when the temperature of the battery does not demand it, the result is that the batteries themselves are cooled below their normal operating temperature. The batteries constitute a considerable thermal mass due to the density of the lead and liquid contained within the battery. This leads to a considerable thermal capacitance, that is, the amount of total heat that can be stored in such a battery. By lowering the temperature of the batteries by a few degrees below the usual operating temperature, a considerable amount of "coldness" is stored therein. More accurately stated, a considerable amount of heat is required to return the temperature of the batteries to their normal operating temperature.

As an example, assume that it is late afternoon and the batteries are at their normal operating temperature of 25° C. (78° F.). Since the ambient temperature and the incident sunlight are decreasing, the enclosure will not require much air conditioning to maintain its internal temperature. After sunset, if the ambient temperature is below the operating temperature of the batteries, no cooling may be necessary. If cost savings measures are not desired, the air conditioner could remain off overnight or only come on as required by the temperature of the batteries. However, if the controller receives information from the clock 26 or solar cell 28 that this is a time at which power may be purchased at a lower cost, the controller will cause the air conditioner to operate, cooling the enclosure and causing the batteries to have a lower temperature than the usual operating temperature, perhaps 18° C.

After sunrise, incident sunlight and ambient air heating will cause heat to be transferred to the enclosure. However, since the batteries have been pre-cooled, it is unnecessary to run the air conditioner until the temperature of the batteries exceeds the normal operating temperature. Thus, the pre-cooled batteries themselves act as a cooling agent to keep the enclosure cool without the need to run the air conditioner. Any heat received in the enclosure or generated by the electronics will cause the temperature of the batteries to return to normal rather than to cause the air conditioner to operate. This may allow the air conditioner to remain off for several hours at a time when electricity prices are at their peak. If there is sufficient thermal capacity in the batteries, it may be possible to leave the air conditioner off completely until the next evening. Even if the air conditioner is only off for a period of hours, a savings may be realized due to the difference between the cost of electricity during peak hours and off-peak hours.

As an example of the kind of savings envisioned, the cost of one kW-hour may be $0.15 during peak periods and only $0.10 during off-peak hours. A 10,000 BTU air conditioner may require 2.07 kW and may run for 4380 hours annually. By operating the air conditioner at off-peak periods, a savings of roughly $450 per year per enclosure is realized. It should remembered that a metropolitan area could have hundreds or even thousands of such enclosures, so that the total savings would be quite large. However, even for an individual enclosure, the electricity savings would be ⅓ of the electricity cost.

A number of further refinements could also be included. If the controller has sufficient calculating ability, it would be possible to calculate how long the thermal capacity of the batteries would be able to keep the enclosure cool. If it is not sufficient to last all afternoon, the controller may cause the air conditioner to operate in the morning hours to keep the batteries at their minimum allowable temperature, so that the cooling is stored until the hotter part of the day and the air conditioner does not operate in the afternoon. This assumes that the peak price for electricity does not start until later in the morning. Similarly, the cooling could start earlier in the evening.

It should be noted that an additional cost savings may be enjoyed by running the air conditioner at night. The efficiency of the air conditioner increases when the ambient temperature is lower. By running the air conditioner at night, more cooling is generated per unit of electricity. This adds to the overall savings of the system.

Further, although the cooling system has been described as an air conditioner, any type of air conditioner or other cooler may be used which is able to cool the enclosure.

For an enclosure having more than one compartment, separate air conditioners or other cooling devices can allow different operating temperatures since the electronics are less affected by higher temperatures. In this arrangement, only the air conditioner for the battery compartment will be controlled to run at night, since the electronics usually do not have sufficient thermal capacity to store the coldness. However, in cases where the electronics compartment does contain sufficient thermal mass, this procedure could be followed in both compartments. Likewise, this procedure could be used for any type of cooled enclosure having a large thermal capacitance and is not restricted to outdoor electronics enclosures.

The present invention has been described herein in terms of several preferred embodiments. However, modifications and additions to these embodiments will become apparent to those of ordinary skill in the art upon a reading of the foregoing description. It is intended that all such modifications and additions comprise a part of the present invention to the extent that they fall within the scope of the several claims appended hereto.

The invention claimed is:

1. A cooling system for an enclosure containing a thermal mass, comprising:
    a cooling device;
    a controller for controlling said cooling device;
    a temperature sensor for measuring a temperature of the thermal mass, wherein said temperature sensor is connected to said controller; and
    a time of day sensor connected to said controller;
    wherein said controller controls said cooling device to cool the thermal mass to a desired temperature during off-peak hours in order to reduce the cost of operating said cooling system;
    wherein the enclosure is an outdoor electronics enclosure containing telecommunications electronics and batteries for providing backup power for the telecommunications electronics.

2. The cooling system according to claim 1, wherein said cooling device is an air conditioner.

3. The cooling system according to claim 1, wherein said time of day sensor is a clock.

4. The cooling system according to claim 1, wherein said time of day sensor is a light sensitive electronic device.

5. A cooling system for an enclosure containing a thermal mass, comprising:
    a cooling device;
    a controller for controlling said cooling device;
    a temperature sensor for measuring a temperature of the thermal mass, wherein said temperature sensor is connected to said controller; and
    a time of day sensor connected to said controller;
    wherein said controller controls said cooling device to cool the thermal mass to a desired temperature during off-peak hours in order to reduce the cost of operating said cooling system;
    wherein the thermal mass is a series of batteries for providing backup power.

6. An outdoors enclosure for electronics, comprising:
    an enclosure;
    electronics contained within said enclosure;
    batteries contained within said enclosure to provide power to said electronics;
    a cooling device for cooling said enclosure;
    a controller for controlling said cooling device;
    a time of day sensor connected to said controller; and
    a temperature sensor for measuring the temperature of said batteries wherein said temperature sensor is connected to said controller;
    wherein said controller controls said cooling device to cool said batteries to a desired temperature during off-peak hours in order to reduce the cost of cooling said enclosure.

7. The cooling system according to claim 6, wherein said cooling device is an air conditioner.

8. The cooling system according to claim 6, wherein said time of day sensor is a clock.

9. The cooling system according to claim 6, wherein said time of day sensor is a light sensitive electronic device.

10. The cooling system according to claim 6, wherein said batteries and said electronics are in separate compartments in said enclosure.

11. The cooling system according to claim 6, wherein said controller controls said cooling device to cool said batteries to a first temperature which is lower than a typical operating temperature during off-peak hours so that the thermal capacitance of said batteries is used to cool the enclosure during peak hours.

12. The cooling system according to claim 11, wherein the typical operating temperature is about 25° C. and the first temperature is about 18° C.

13. A method of operating a cooling system for an outdoor electronics enclosure, comprising:
    determining the time of day;
    measuring a temperature inside the enclosure; and
    controlling the cooling system to cool the enclosure during off-peak hours to a temperature below a typical operating temperature so as to use the thermal capacitance of the enclosure and/or the enclosure's content to cool the enclosure during peak hours;
    wherein the outdoor electronics enclosure contains telecommunications electronics and batteries for providing backup power for the telecommunications electronics.

14. The method according to claim 13, wherein the batteries are pre-cooled during off-peak hours and the batteries' thermal capacitance stores coolness so that the cooling system may be used less during peak hours.

15. The method according to claim 13, wherein the time of day is determined by a clock.

16. The method according to claim 13, wherein the time of day is determined by a light sensitive electronic device.

17. The method according to claim 13, wherein the typical operating temperature is about 25° C. and the temperature below the typical operating temperature is about 18° C.

18. The method according to claim 13, wherein the cooling system includes a controller connected to a time of day sensor and a temperature sensor in the enclosure, the controller using stored peak cost time data to determine times to operate the cooling system at off-peak prices.

* * * * *